United States Patent [19]
Polson, Jr.

[11] 3,783,409
[45] Jan. 1, 1974

[54] SYSTEM FOR LINEARIZING INHERENTLY NONLINEAR CIRCUITS

[75] Inventor: Lawrence L. Polson, Jr., Los Altos, Calif.

[73] Assignee: Itek Corporation, Lexington, Mass.

[22] Filed: Apr. 12, 1973

[21] Appl. No.: 350,673

[52] U.S. Cl. ............... 331/177 R, 330/86, 330/109, 331/181, 333/17 R
[51] Int. Cl. .............................................. H03b 3/04
[58] Field of Search ........................ 331/177 R, 181; 330/4.8, 86, 109, 110; 307/271; 333/17 R, 17 M; 328/150; 334/11, 14; 332/18, 29 M

[56] References Cited

UNITED STATES PATENTS

| | | | |
|---|---|---|---|
| 3,477,040 | 11/1969 | Meyer | 331/177 R X |
| 3,576,503 | 4/1971 | Hanson | 331/177 R X |
| 3,735,276 | 5/1973 | Apolant | 331/177 R X |

*Primary Examiner*—Herman Karl Saalbach
*Assistant Examiner*—Siegfried H. Grimm
*Attorney*—Homer O. Blair et al.

[57] ABSTRACT

A system for allowing an inherently nonlinear, YIG tuned oscillator to respond linearly to an input signal. The output of the oscillator is directed to a YIG tuned discriminator which is tuned to its center frequency by the same input signal utilized to tune the oscillator. The discriminator is selected to have a nonlinear response which is proportional to, but not equal to, the nonlinear response of the oscillator. The output of the discriminator is utilized in a first feed back loop to drive the center frequency of the discriminator toward the oscillator frequency. The discriminator output signal is also proportional to the inherent oscillator nonlinearity, and is utilized in a second feed back loop to drive the oscillator toward a linear response to the input signal.

4 Claims, 3 Drawing Figures

SYSTEM FOR LINEARIZING INHERENTLY NONLINEAR CIRCUITS

BACKGROUND OF THE INVENTION

The present invention relates generally to nonlinear circuits, and more particularly pertains to a new and improved system for allowing an inherently nonlinear YIG tuned oscillator to have a substantially linear response to an input tuning signal.

In microwave receivers, ferrimagnetic resonant microwave circuits in the form of YIG (yttrium-iron-garnet) tuned filters and oscillators are widely utilized. All of these circuits are controlled in frequency by varying the magnetic field applied to single crystal spheres of YIG material. Silicon steel magnetic materials are utilized to generate relatively high magnetic flux densities in these devices, and as a result, these circuits exhibit both the hysteresis and nonlinearity of the magnetic material. The severity of these magnetic problems increases with higher frequencies and wider bandwidths. It would be desirable to have YIG tuned circuits which have substantially linear responses to input signals.

SUMMARY OF THE INVENTION

In accordance with a preferred embodiment, a system is disclosed for allowing a tunable circuit having an inherently nonlinear response to an input signal to linearly respond to that input signal. A tunable nonlinear discriminator is also coupled to the input signal to be tuned thereby. The output signal of the nonlinear circuit is directed as an input to the discriminator for measurement thereby. The discriminator is selected to have a nonlinear response to the input signal which is proportional to, but not equal to, the nonlinear response of the nonlinear circuit. The system includes two feedback circuits. A first feedback circuit feeds the output of the discriminator back to its input to tune the discriminator to the output signal of the nonlinear circuit. A second feedback circuit directs the output of the discriminator to the input of the nonlinear circuit to tune the nonlinear circuit toward a linear response to the input signal. Further, the preferred embodiment provides such a system wherein the tunable circuit and the tunable discriminator each include a magnetic circuit having an inherently nonlinear response to the input signal because of hysteresis. Also, the preferred embodiment provides such a system wherein the tunable circuit and the tunable discriminator are each YIG tuned circuits. Further, the preferred embodiment provides such a system wherein the nonlinear circuit is a YIG tuned oscillator.

DESCRIPTION OF A PREFERRED EMBODIMENT

Figure 1:
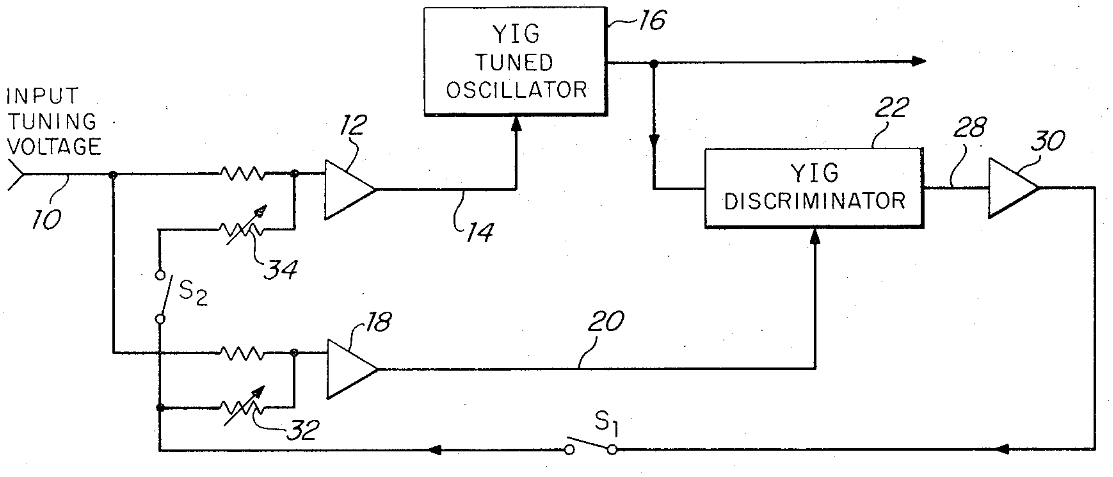
FIG. 1 is a block diagram of a preferred embodiment of the invention.
Figure 2:
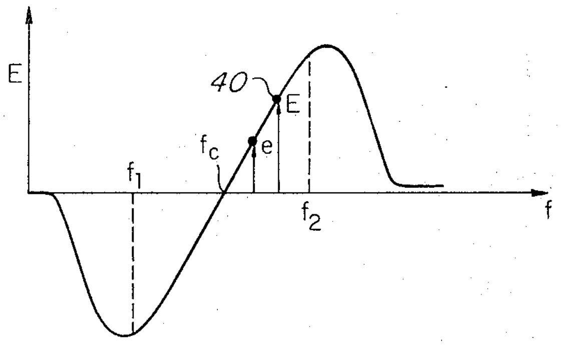
FIGS. 2 and 3 are graphs of performance characteristics which are useful in explaining the operation of the preferred embodiment.

Referring to FIG. 1 there is illustrated a preferred embodiment of the invention. An input signal in the form of a tuning voltage on input line 10 is applied to a YIG driver amplifier 12. The YIG driver amplifier provides a tuning current on line 14 which is applied to an electromagnetic circuit in YIG tuned oscillator 16 to control the magnetic field applied to the single crystal sphere of YIG material in the oscillator. Silicon steel magnetic materials are utilized to generate the relatively high magnetic flux densities required in the oscillator, and as a result the oscillator exhibits the hysteresis and nonlinearity of the magnetic material. The tuning voltage on Line 10 is also directed to a second YIG driver amplifier 18. YIG driver amplifier 18 produces a current on line 20 to drive the electromagnetic circuit of a YIG tuned discriminator 22. Thus, the tuning voltage on line 10 controls the frequency of YIG tuned oscillator 16 and also the center frequency of YIG tuned discriminator 22. YIG tuned discriminator 22 is connected to the output of YIG tuned oscillator 16 to compare its frequency against the center frequency to which the YIG tuned discriminator is tuned. YIG tuned discriminator 22 may be a typical discriminator having a response as illustrated in FIG. 2. In FIG. 2, $f_c$ is the center frequency to which the discriminator is tuned. The discriminator has a linear range extending from $f_1$ to $f_2$ in which it will produce an output signal E proportional to the difference between its input frequency and its tuned center frequency. If the input frequency is below the tuned center frequency, the discriminator will produce a negative output signal E. Conversely if the input frequency is above the tuned center frequency the discriminator will produce a positive output signal E. The output of YIG tuned discriminator 22 on Line 28 is directed to an amplifier 30, the output of which is then utilized in a feedback circuit to adjust the input signals to both the YIG tuned oscillator and the YIG tuned discriminator. The feedback circuit includes an adjustable resistor 32 at the input to driving amplifier 18 and an adjustable resistor 34 at the input to driving amplifier 12. Adjustable resistors 32 and 34 control the magnitudes of the correction signals applied respectively to YIG tuned discriminator 22 and YIG tuned oscillator 16. The proper adjustment of these variable resistors will be discussed in more detail during the description of the operation of the preferred embodiment. Two switches $S_1$ and $S_2$ are shown in FIG. 1, and these switches have been inserted into the circuit merely for purposes of explaining the operation of the circuit. In the preferred embodiment, neither switch would be present.

Figure 3:
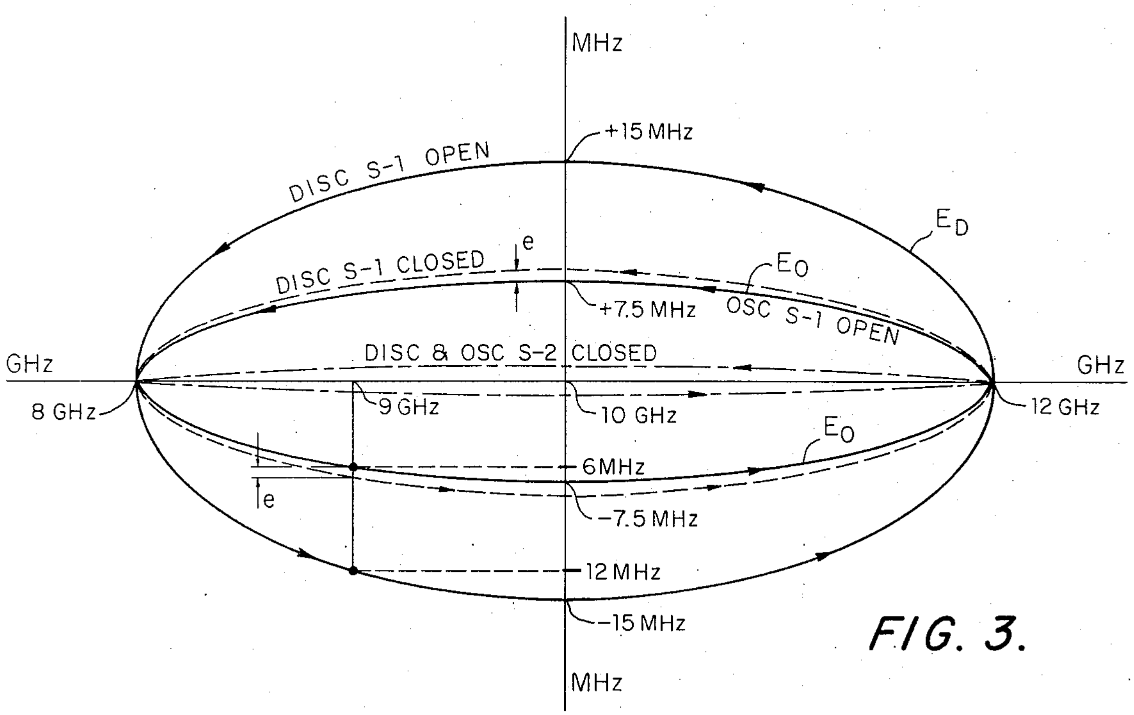

Referring to FIG. 3, there is illustrated the nonlinear hysteresis curve $E_o$ for a YIG tuned oscillator. In the graph of FIG. 3 the abscissa represents the bandwidth of the oscillator which extends from 8 to 12 GHz. The ordinate represents frequency error in MHz over the bandwidth of 8 to 12 GHz. The oscillator frequency error is present because of the hysteresis and nonlinearity present in the electromagnetic circuit of the YIG tuned oscillator. The curve $E_o$ illustrates the response of the oscillator when a linear input signal is introduced on line 10 to drive the oscillator from 8 to 12 GHz. As can be seen by the bottom of curve $E_o$, as a linear signal is applied to the oscillator to drive it from 8 to 12 GHz, the oscillator responds with a nonlinear frequency which builds up to a maximum error of minus 7.5 MHz at 10 GHz. The top of curve $E_o$ illustrates the response of the oscillator when a linear signal is introduced on input line 10 to drive the oscillator from 12GHz back to 8 GHz. As the oscillator is driven back to 8 GHz it reaches a maximum error of ±7.5 MHz at 10 GHz. A hysteresis curve $E_D$ for the discriminator 22 is also illustrated in FIG. 2. As illustrated, the discriminator 22 is selected to have a nonlinear response $E_D$ which is proportional to, but not equal to, the nonlinear response $E_o$ of the oscillator 16 (i.e. $E_D/E_o = K$). In the illustrated embodiment, the discriminator nonlinear response curve $E_D$ is approximately twice the oscillator nonlinear response curve $E_o$ over the entire bandwidth. In other embodiments, other proportionalities might be selected, and in some embodiments the discriminator nonlinearity curve might be proportionately less than the oscillator non-linearity curve.

The operation of the circuit of FIG. 1 will now be explained. Assume initially that both switches S–1 and S–2 are open. Utilizing one particular example in FIG. 3, assume that an input voltage is present on line 10 which should drive the frequency of the oscillator and the center frequency of the discriminator from 8 to 9 GHz if each circuit responded linearly to that input signal. As illustrated in FIG. 2, because of the nonlinearity of these circuits, the oscillator responds with a frequency which is approximately 6 MHz below 9 GHz, and the discriminator responds with a center frequency which is approximately 12 MHz below 9 GHz. Assume that discriminator 22 has a typical discriminator output curve, as illustrated in FIG. 2, and that the 6 MHz difference is within the linear range of the discriminator, for instance at point 40 on the curve. Then the discriminator will produce on line 28 a positive voltage E indicating that the frequency of oscillator 16 is 6 MHz higher than the center frequency of discriminator 22. This signal E with switch S–1 open is the open loop discriminator error voltage. If S–1 is now closed, the error signal is applied to the discriminator tuning amplifier via resistor 32 and is summed with the coarse tuning voltage on line 10 as a correction. The discriminator is now forced by the applied error correction to approach the oscillator frequency with a smaller error *e* as shown in FIGS. 2 and 3. The discriminator loop gain summing resistor 32 is adjusted for a minimum error *e* by increasing gain to a point below which instability (oscillation) of the loop occurs. *e* then may be small but not zero for zero error implies infinite gain which is an unstable condition.

The error signal E produced by the discriminator is also very nearly proportional to $E_D - E_0$ because of the selected proportionality between $E_D$ and $E_0$. Thus to a first order approximation, $E = K'(E_D - E_0)$. Also, since $E_D/E_0 = K$, then $E = K'(KE_0 - E_0) = K'(K-1)E_0$ and $E = K''E_0$ where $K'' = K'(K-1)$. Thus the resulting error signal E from the discriminator is proportional to the oscillator tuning nonlinearity. The small error e is also proportional to the oscillator nonlinearity since the magnitude of e is related to E by the discriminator gain control setting 32. The shape of the hysteresis nonlinearity of both the oscillator and discriminator are preserved in the small error voltage *e*. If this voltage is summed with the oscillator tuning voltage on line 10 in proper sense by closing switch S–2 the magnitude of this correction may be adjusted by oscillator correction gain control 34 to cancel the nonlinearity error of the oscillator. If the gain is insufficient the oscillator frequency will still be low tuning from 8 to 12GHz but by a proportionally smaller amount. Excess gain will overcorrect and the oscillator frequency will be high tuning from 8 to 12 GHz. If the similarity proportion constant K is indeed a constant, then proper adjustment of the correction signal magnitude (by adjustment of resistors 32 and 34) will result in total hysteresis nonlinearity cancellation.

It is necessary that the nonlinear response of the discriminator be less than or greater than the oscillator response but not equal since the error would then be zero and no correction would be possible.

While utilizing the teachings of this invention, the extent of the linearity achieved depends upon the reasonable constancy of the proportionality between the hysteresis characteristics of the YIG circuits over the bandwidth of interest. In some embodiments, the nonlinearity curves may not have the clear proportionality shown in FIG. 2. This difficulty may be alleviated to a degree by the addition of nonlinear elements in the feedback circuits of those embodiments.

In a typical microwave receiver having many YIG tuned circuits with matched or related magnetic tuning characteristics, all of the circuits may be tracked with the oscillator in a manner similar to that illustrated in FIG. 1. For example, the hysteresis error signal from the discriminator-oscillator comparison may be applied to linearize other YIG circuits such as filters and the tracking preselector. Since similar YIG tuned circuits inherently have similar characteristics, the application of the teachings of this invention wil yield greatly improved tuning characteristics of these circuits even without a serious effort to carefully match and scale the magnetic characteristics between the circuits. It is only necessary that the nonlinearity proportionality be similar for each component.

Another advantage of the preferred embodiment is that the oscillator frequency is more effectively stabilized since the discriminator by design is more easily susceptible to temperature compensation. In other words, the stability of the discriminator is the controlling factor in maintaining oscillator tracking and stability as well as in eliminating hysteresis caused nonlinearities.

The teachings of the preferred embodiment are broadly applicable to all types of tuned microwave receivers. Also, the teachings of this invention are broadly applicable to nonlinear circuits which are capable of utilizing a discriminator having a nonlinear response which is proportional to, but not equal to, the nonlinear response of the circuits. While several embodiments have been described, the teachings of this invention will suggest many other embodiments to those skilled in the art.

I claim

1. A system for allowing a tunable circuit having an inherently nonlinear response to an input tuning signal to linearly respond to that input tuning signal and comprising:

a. a tunable nonlinear circuit for producing an output signal in response to an input tuning signal, said circuit having an inherently nonlinear response to the input tuning signal;

b. a tunable nonlinear discriminator means coupled to the input signal to be tuned thereby and also coupled to the output signal of said nonlinear circuit to measure said output signal, said discriminator means having an inherently nonlinear response to the input tuning signal which is proportional to, but not equal to, the nonlinear response of said nonlinear circuit;

c. means for coupling in a feedback circuit the output of said discriminator means back to the input of said discriminator means for combination with the input tuning signal to tune said discriminator toward the output signal of said nonlinear circuit; and d. means for coupling in a feedback circuit the output of said discriminator means to the input of said nonlinear circuit for combination with the input tuning signal to tune said nonlinear circuit toward a linear response to the input signal.

2. A system as set forth in claim 1 and wherein:

a. said tunable nonlinear circuit includes a magnetic circuit which has an inherently nonlinear response to the input signal because of hysteresis in the magnetic circuit; and b. said nonlinear discriminator means includes a magnetic circuit which has an inherently nonlinear response to the input signal because of hysteresis in the magnetic circuit.

3. A system as set forth in claim 2 and wherein:

a. said tunable, nonlinear circuit includes a YIG tuned circuit; and b. said tunable, nonlinear discriminator means includes a YIG tuned discriminator.

4. A system as set forth in claim 3 wherein said YIG tuned circuit comprises a YIG tuned oscillator having a nonlinear frequency response to an input signal.

* * * * *